(12) United States Patent
Kim et al.

(10) Patent No.: US 9,519,195 B2
(45) Date of Patent: Dec. 13, 2016

(54) MANUFACTURING METHOD OF DISPLAY DEVICE

(71) Applicant: Samsung Display Co., Ltd., Yongin-si, Gyeonggi-Do (KR)

(72) Inventors: Younggu Kim, Daejeon (KR); Kyungho Park, Suwon-si (KR); Suji Park, Seoul (KR); Yeongrong Park, Osan-si (KR); Baekkyun Jeon, Yongin-si (KR); Minsik Jung, Yongin-si (KR); Jaeweon Hur, Busan (KR)

(73) Assignee: Samsung Display Co., Ltd., Samsung-ro, Giheung-Gu, Yongin-si, Gyeonggi-Do (KR)

( * ) Notice: Subject to any disclaimer, the term of this patent is extended or adjusted under 35 U.S.C. 154(b) by 0 days.

(21) Appl. No.: 14/820,327

(22) Filed: Aug. 6, 2015

(65) Prior Publication Data
US 2016/0216547 A1  Jul. 28, 2016

(30) Foreign Application Priority Data

Jan. 22, 2015 (KR) ........................ 10-2015-0010705

(51) Int. Cl.
| H01L 27/146 | (2006.01) |
| G02F 1/1343 | (2006.01) |
| G02F 1/1339 | (2006.01) |
| G02F 1/136 | (2006.01) |
| G02F 1/1337 | (2006.01) |
| G02F 1/1335 | (2006.01) |

(Continued)

(52) U.S. Cl.
CPC .......... *G02F 1/13439* (2013.01); *G02F 1/136* (2013.01); *G02F 1/1339* (2013.01); *G02F 1/133516* (2013.01); *G02F 1/133788* (2013.01); *H01L 27/1225* (2013.01); *H01L 27/1469* (2013.01); *H01L 27/14634* (2013.01); *G02F 2001/133357* (2013.01)

(58) Field of Classification Search
None
See application file for complete search history.

(56) References Cited

U.S. PATENT DOCUMENTS

| 6,063,829 A | 5/2000 | Endou et al. |
| 8,045,109 B2 | 10/2011 | Kondo et al. |

(Continued)

FOREIGN PATENT DOCUMENTS

| KR | 10-2007-0071798 A | 7/2007 |
| KR | 10-2014-0028605 A | 3/2014 |

*Primary Examiner* — Cheung Lee
(74) *Attorney, Agent, or Firm* — Robert E. Bushnell, Esq.

(57) ABSTRACT

A method of manufacturing a display device including a thin substrate disposed with a rear electrode that is capable of preventing defects caused by static electricity, the method comprising adhering a first auxiliary substrate on an outer surface of a first substrate; forming a rear electrode on an outer surface of a second substrate, the second substrate being disposed opposed to the first substrate; adhering a second auxiliary substrate on the rear electrode; disposing a liquid crystal layer between an inner surface of the first substrate and an inner surface of the second substrate and adhering the first substrate and the second substrate together; and removing the first auxiliary substrate and the second auxiliary substrate from the first substrate and the second substrate, respectively.

20 Claims, 7 Drawing Sheets

(51) Int. Cl.
  *H01L 27/12*    (2006.01)
  *G02F 1/1333*   (2006.01)

(56) References Cited

U.S. PATENT DOCUMENTS

| | | | |
|---|---|---|---|
| 2002/0196393 A1* | 12/2002 | Tashiro | G02F 1/1303 349/106 |
| 2003/0169392 A1* | 9/2003 | Park | G02F 1/1339 349/153 |
| 2004/0178527 A1 | 9/2004 | Liao et al. | |
| 2012/0231566 A1* | 9/2012 | Oh | G02F 1/1333 438/27 |
| 2014/0179190 A1* | 6/2014 | Lee | G02F 1/1333 445/24 |

\* cited by examiner

MANUFACTURING METHOD OF DISPLAY DEVICE

CLAIM OF PRIORITY

This application claims the priority of and all the benefits accruing under 35 U.S.C. §119 of Korean Patent Application No. 10-2015-0010705, filed on Jan. 22, 2015, with the Korean Intellectual Property Office (KIPO), the disclosure of which is incorporated herein in its entirety by reference.

BACKGROUND OF THE INVENTION

1. Field of Disclosure

Embodiments of the present invention relate to a method of manufacturing a display device.

2. Description of the Related Art

A liquid crystal display (LCD) device is a type of flat panel displays (FPDs), which is most widely used these days. An LCD device includes two substrates including electrodes formed thereon and a liquid crystal layer interposed therebetween. Upon applying voltage to two electrodes, liquid crystal molecules of the liquid crystal layer are rearranged, thereby adjusting an amount of transmitted light.

The LCD device has an issue of inferior side visibility relative to front visibility. Thus, development has been conducted on various schemes of liquid crystal alignment and driving methods of the LCD device to improve side visibility. In particular, an LCD device which includes two electric-field generating electrodes disposed on a single substrate has drawn attention.

Further, in order to achieve improved portability and enhanced slimness of a display device equipped with the LCD device, an LCD device including a thin substrate is being developed.

It is to be understood that this background of the technology section is intended to provide useful background for understanding the technology and as such disclosed herein, the technology background section may include ideas, concepts or recognitions that were not part of what was known or appreciated by those skilled in the pertinent art prior to a corresponding effective filing date of subject matter disclosed herein.

SUMMARY OF THE INVENTION

Aspects of embodiments of the present invention are directed to a method of manufacturing a display device including a thin substrate formed with a rear electrode, the rear electrode preventing a defect caused by static electricity.

According to an exemplary embodiment, a method of manufacturing a display device includes adhering a first auxiliary substrate on an outer surface of a first substrate; forming a rear electrode on an outer surface of a second substrate, the second substrate being disposed opposed to the first substrate; adhering a second auxiliary substrate on the rear electrode; disposing a liquid crystal layer between an inner surface of the first substrate and an inner surface of the second substrate and adhering the first substrate and the second substrate together; and removing the first auxiliary substrate and the second auxiliary substrate from the first substrate and the second substrate, respectively.

The first substrate and the second substrate may each have a thickness in a range of about 0.05 millimeters (mm) to about 0.5 mm.

The first auxiliary substrate and the second auxiliary substrate may each have a thickness in a range of about 0.4 mm to about 0.7 mm.

The adhering of the first auxiliary substrate may include bringing the first auxiliary substrate into contact with an outer surface of the first substrate and adhering them, under an atmospheric pressure or in a vacuum state.

The forming of the rear electrode may include depositing indium tin oxide (ITO) or indium zinc oxide (IZO) on the outer surface of the second substrate.

The adhering of the second auxiliary substrate may include bringing the second auxiliary substrate into contact with the rear electrode and adhering them, under an atmospheric pressure or in a vacuum state.

The removal of the first auxiliary substrate and the second auxiliary substrate may include applying a shear force on an end portion of each of the first auxiliary substrate and the second auxiliary substrate to remove them from the first substrate and the second substrate, respectively.

The method may further include, subsequent to the adhering of the first auxiliary substrate on the outer surface of the first substrate, forming a thin film transistor (TFT) array on the inner surface of the first substrate, the TFT array comprising a gate line, a data line intersecting the gate line, a TFT connected to the gate line and the data line, a pixel electrode connected to the TFT, and a common electrode disposed to be insulated from the pixel electrode.

The method may further include, subsequent to the formation of the TFT array on the inner surface of the first substrate, forming a first alignment layer on the TFT array.

The first alignment layer may include a photo-sensitive polymer material.

The method may further include, subsequent to the formation of the first alignment layer on the TFT array, performing photoalignment of the first alignment layer.

The performing of the photoalignment may include irradiating ultraviolet (UV) light on the first alignment layer, the UV light polarized in a predetermined direction.

The method may further include, subsequent to the adhering of the second auxiliary substrate on the rear electrode, forming a color filter array on the inner surface of the second substrate, the color filter array comprising light shielding units having a lattice form, a color filter between the light shielding units, and a planarization layer configured to cover the light shielding unit and the color filter.

The method may further include, subsequent to the formation of the color filter array on the inner surface of the second substrate, forming a second alignment layer on the color filter array.

The second alignment layer may include a photo-sensitive polymer material.

The method may further include, subsequent to the formation of the second alignment layer on the color filter array, performing photoalignment of the second alignment layer.

The performing of the photoalignment may include irradiating UV light on the second alignment layer, the UV light polarized in a predetermined direction.

According to embodiments of the present invention, a rear electrode is formed on a thin substrate absent two electric-field generating electrodes, thereby preventing a defect which is caused by static electricity generated thereover during a manufacturing process.

Further, according to embodiments of the present invention, subsequent to forming a rear electrode and then adhering an auxiliary substrate thereto, a process of forming a thin substrate is performed. Accordingly, bending of the thin substrate, which may occur in the manufacturing process, may be prevented and moreover, a dropping stain may not appear, thereby allowing the display device to exhibit improved display quality.

The foregoing is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings, in which like reference symbols indicate the same or similar components, wherein.

DETAILED DESCRIPTION OF THE INVENTION

Figure 1:
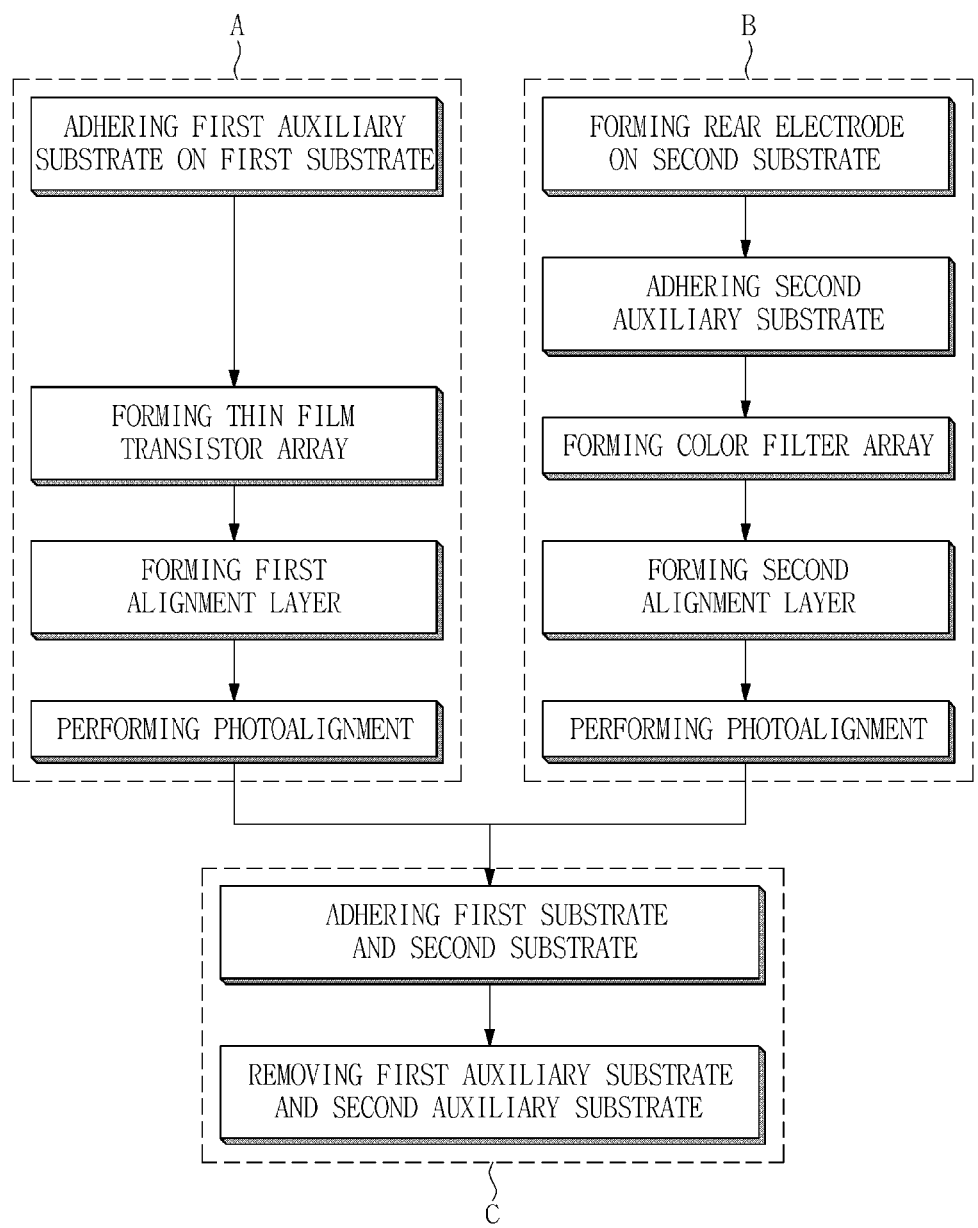
FIG. 1 is a flow chart illustrating a method of manufacturing a display device according to an exemplary embodiment.

Advantages and features of the present invention and methods for achieving them will be made clear from embodiments described below in detail with reference to the accompanying drawings. The present invention may, however, be embodied in many different forms and should not be construed as being limited to the embodiments set forth herein. Rather, these embodiments are provided so that this disclosure will be thorough and complete, and will fully convey the scope of the invention to those skilled in the art. The present invention is merely defined by the scope of the claims. Therefore, well-known constituent elements, operations and techniques are not described in detail in the embodiments in order to prevent the present invention from being obscurely interpreted. Like reference numerals refer to like elements throughout the specification.

The spatially related terms "below", "beneath", "lower", "above", "upper", and the like, may be used herein for ease of description to describe the relations between one element or component and another element or component as illustrated in the drawings. It will be understood that the spatially related terms are intended to encompass different orientations of the device in use or operation, in addition to the orientation depicted in the drawings. For example, in the case where a device shown in the drawing is turned over, the device positioned "below" or "beneath" another device may be placed "above" another device. Accordingly, the illustrative term "below" may include both the lower and upper positions. The device may also be oriented in the other direction, and thus the spatially related terms may be interpreted differently depending on the orientations.

The terminology used herein is for the purpose of describing particular example embodiments only and is not intended to be limiting. As used herein, the singular forms "a", "an" and "the" may be intended to include the plural forms as well, unless the context clearly indicates otherwise.

The terms "comprises", "comprising", "including", and "having", are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

Unless otherwise defined, all terms used herein (including technical and scientific terms) have the same meaning as commonly understood by those skilled in the art to which this invention pertains. It will be further understood that terms, such as those defined in commonly used dictionaries, should be interpreted as having a meaning that is consistent with their meaning in the context of the relevant art and will not be interpreted in an ideal or excessively formal sense unless clearly defined in the present specification.

FIG. 1 is a flow chart illustrating a method of manufacturing a display device according to an exemplary embodiment.

The method of manufacturing a display device may be broadly divided into three steps, i.e. a thin film transistor ("TFT") array process ("A") for forming a TFT array on a first substrate; a color filter array process ("B") for forming a color filter array on a second substrate opposed to the first substrate; and an adhering and removing process ("C") for adhering the first substrate and the second substrate together and then removing a first auxiliary substrate and a second auxiliary substrate.

The TFT array process A will be described further with reference to FIGS. 2A through 2D, the color filter array process B will be described further with reference to FIGS. 3A through 3E, and the adhering and removing process C will be described further with reference to FIGS. 4A and 4B.

FIGS. 2A through 2D are cross-sectional views illustrating the process A of FIG. 1.

Figure 2A:
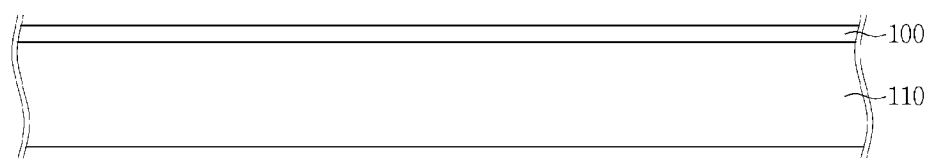
FIGS. 2A through 2D are cross-sectional views illustrating a process A of FIG. 1.

Firstly, a first auxiliary substrate 110 may be adhered to an outer surface of the first substrate 100 (refer to FIG. 2A). Herein, the outer surface of the first substrate 100 refers to a surface that is not opposed to a second substrate 200 to be described herein below, the second substrate 200 being opposed to the first substrate 100.

The first substrate 100 may include glass or plastics, and in particular, may be a thin substrate having a thickness in a range of about 0.05 millimeters (mm) to about 0.5 mm. The first auxiliary substrate 110 may include glass or plastics, and may have a thickness in a range of about 0.4 mm to about 0.7 mm.

The first auxiliary substrate 110 may be adhered to the outer surface of the first substrate 100 by Van der Waal's force, which is caused when the first auxiliary substrate 110 is brought into contact therewith under an atmospheric pressure or in a vacuum state. However, the present invention is not limited thereto, and the first auxiliary substrate 110 may be adhered to the outer surface of the first substrate 100 using an additional adhesive layer.

A conventional method of manufacturing a display device including a thin substrate may employ the steps of adhering two substrates, each including a TFT array and a color filter array formed thereon and having a normal thickness, and then performing etching thereon; in this case, however, a defect may occur by impacts imposed thereto in the etching process, and moreover, manufacturing cost may increase as well.

Another conventional method may employ the step of forming a TFT array directly on a thin substrate; in this case, however, bending or distortion defects of the thin substrate may occur in the manufacturing process thereof.

According to the present invention, the auxiliary substrate may be adhered to the thin substrate prior to forming the TFT array, thereby preventing defects caused by impacts and also preventing bending or distortion defects of the thin substrate.

Figure 2B:
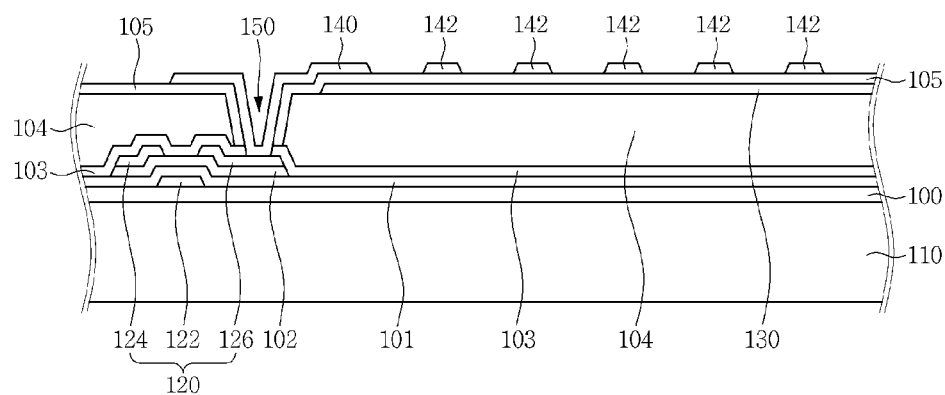

According to an exemplary embodiment, subsequent to the first auxiliary substrate 110 being adhered to the outer surface of the first substrate 100, the TFT array may be formed on an inner surface of the first substrate 100, the TFT array including a gate line (not illustrated), a data line (not illustrated) intersecting the gate line, a TFT 120 connected to the gate line and the data line, a pixel electrode 140 connected to the TFT, and a common electrode 130 disposed to be insulated from the pixel electrode 140, (refer to FIG. 2B).

The gate line may be formed on the first substrate 100 in a transverse direction. However, the present invention is not limited thereto, and the gate line may be disposed in a longitudinal direction.

The gate line may include, for example, an aluminum (Al)-based metal such as aluminum (Al) or an aluminum (Al) alloy, a silver (Ag)-based metal such as silver (Ag) or an silver (Ag) alloy, a copper (Cu)-based metal such as copper (Cu) or a copper (Cu) alloy, a molybdenum (Mo)-based metal such as molybdenum (Mo) or a molybdenum (Mo) alloy, chromium (Cr), tantalum (Ta), or titanium (Ti). However, the present invention is not limited thereto, and the gate line may have a multi-layer structure including at least two conductive layers that have different physical properties.

The data line may be disposed in a longitudinal direction to intersect the gate line, and may be insulated from the gate line by a gate insulating layer 101. However, the present invention is not limited thereto, and in a case where the gate line is disposed in a longitudinal direction, the data line may be disposed in a transverse direction to intersect the gate line.

The data line may include refractory metal, such as molybdenum (Mo), chromium (Cr), tantalum (Ta) and titanium (Ti), or metal alloys thereof. However, the present invention is not limited thereto, and the data line may have a multi-layer structure including a refractory metal layer and a low-resistance conductive layer.

The TFT 120 may include a gate electrode 122 connected to the gate line, a source electrode 124 connected to the data line, and a drain electrode 126 connected to the pixel electrode 140 through a contact hole 150.

The gate electrode 122 may be insulated from the source electrode 124 and the drain electrode 126 by the gate insulating layer 101. A semiconductor layer 102 may be disposed between the gate insulating layer 101 and the source electrode 124 and between the gate insulating layer 101 and the drain electrode 126.

The gate electrode 122 may include conductive materials, and may have a monolayer or multi-layer structure including one of molybdenum (Mo), aluminum (Al), chromium (Cr), gold (Au), titanium (Ti), nickel (Ni), neodymium (Nd) and copper (Cu), or alloys thereof. However, the present invention is not limited thereto, and the gate electrode 122 may include various conductive materials.

The gate insulating layer 101 is disposed on the first substrate 100 to cover the gate electrode 122. The gate insulating layer 101 may prevent infiltration of moisture or undesired materials through the first substrate 100. The gate insulating layer 101 may include insulating materials, and may have a monolayer or multi-layer structure including silicon nitride (SiNx) or silicon oxide (SiOx). However, the present invention is not limited thereto, and the gate insulating layer 101 may include various insulating materials.

The semiconductor layer 102 may include an oxide semiconductor. The oxide semiconductor may be a metal oxide semiconductor, and may include one or more of metals such as zinc (Zn), indium (In), gallium (Ga), tin (Sn), and titanium (Ti), and an oxide thereof. For example, the oxide semiconductor may include at least one of zinc oxide (ZnO), indium-gallium-zinc oxide (IGZO), and indium-zinc-tin oxide (IZTO). However, the present invention is not limited thereto, and the semiconductor layer 102 may include various materials.

The source electrode 124 is disposed on the semiconductor layer 102. The source electrode 124 may include conductive materials, and may have a monolayer or multi-layer structure including one of molybdenum (Mo), aluminum (Al), chromium (Cr), gold (Au), titanium (Ti), nickel (Ni), neodymium (Nd) and copper (Cu), or alloys thereof. However, the present invention is not limited thereto, and the source electrode 124 may be formed of various conductive materials.

The drain electrode 126 is disposed on the semiconductor layer 102 to be spaced apart from the source electrode 124. The drain electrode 126 may include conductive materials, and may have a monolayer or multi-layer structure formed using one of molybdenum (Mo), aluminum (Al), chromium (Cr), gold (Au), titanium (Ti), nickel (Ni), neodymium (Nd) and copper (Cu), or alloys thereof. However, the present invention is not limited thereto, and the drain electrode 126 may be formed of various conductive materials.

Although not illustrated, an ohmic contact layer may further be disposed between the source electrode 124 and the semiconductor layer 102 and between the drain electrode 126 and the semiconductor layer 102. The ohmic contact layer (not illustrated) may include a material such as silicide or n+ amorphous silicon doped with n-type impurities at high concentration.

A first protective layer 103 may be formed to cover the source electrode 124 and the drain electrode 126, and may have a contact hole 150 formed on the drain electrode 126. The first protective layer 103 may include organic insulating materials or inorganic insulating materials, such as silicon nitride (SiNx) or silicon oxide (SiOx).

An organic layer 104 may be formed to cover the first protective layer 103, and may have an aperture in an area corresponding to the contact hole 150 of the first protective layer 103. The organic layer 104 may have a thickness more than that of the first protective layer 103, and may have a planar surface.

The common electrode 130 is formed on the organic layer 104. The common electrode 130 may include transparent conductive materials.

A second protective layer 105 may be formed to cover the organic layer 104 and the common electrode 130, and may have an aperture in an area corresponding to the contact hole 150 of the first protective layer 103. The second protective layer 105 may include organic insulating materials or inorganic insulating materials, such as silicon nitride (SiNx) or silicon oxide (SiOx).

The pixel electrode 140 is formed on the second protective layer 105. The pixel electrode 140 may include transparent conductive materials. The pixel electrode 140 may receive voltage from the drain electrode 126 through the contact hole 150.

The pixel electrode 140 may include a plurality of branch electrodes 142, and the plurality of branch electrodes 142 may be formed to overlap the common electrode 130. However, the present invention is not limited thereto, and the pixel electrode 140 may be formed on the organic layer 104, and the common electrode 130 may be formed on the second protective layer 105.

Figure 2C:
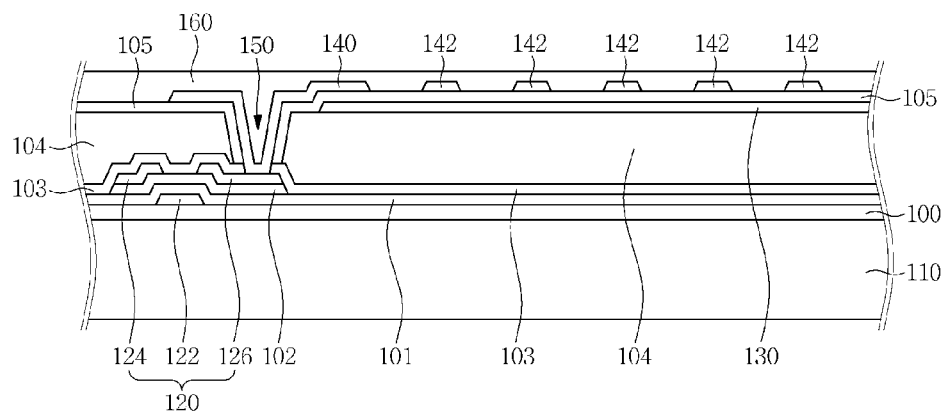

Subsequent to the TFT array being formed on the inner surface of the first substrate 100, a first alignment layer 160 may be formed on the TFT array, more particularly, on the pixel electrode 140 (refer to FIG. 2C).

The first alignment layer 160 may include photo-sensitive polymer materials. The photo-sensitive polymer materials may include polyimide main chains and side chains connected to the polyimide main chains. The side chains may have a double-bond structure, which allows the side chains to have aromaticity. However, the present invention is not limited thereto, and the photo-sensitive polymer material may include various materials Subsequent to the first alignment layer 160 being formed on the TFT array, the first alignment layer 160 may be photo-aligned (refer to FIG. 2D)

The photoalignment may be performed in a way of irradiating ultraviolet (UV) light, which is polarized in a predetermined direction, onto the first alignment layer 160. For example, when a UV light, having a polarization axis in the same plane as the direction of the side chain, is incident, the side chains may undergo photopolymerization reaction to have structural anisotropy, and may have a linear inclination direction to be inclined in the incident direction of the UV light. However, the present invention is not limited thereto, and the first alignment layer 160 may have a linear inclination direction in an opposite direction with respect to the incident direction of the polarized UV light. Further, various lights, for example, ion beams, may be utilized in lieu of the UV light.

FIGS. 3A through 3E are cross-sectional views illustrating a process B of FIG. 1.

Figure 3A:
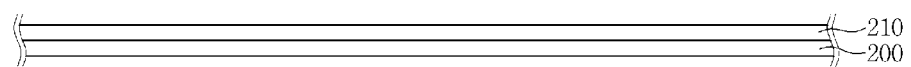
FIGS. 3A through 3E are cross-sectional views illustrating a process B of FIG. 1.

Firstly, a rear electrode 210 is formed on an outer surface of the second substrate 200 (refer to FIG. 3A). Herein, the outer surface of the second substrate 200 refers to a surface that is not opposed to the first substrate 100.

The second substrate 200 may include glass or plastics. In particular, the second substrate 200 may be a thin substrate having a thickness in a range or about 0.05 mm to about 0.5 mm.

The rear electrode 210 may be formed by performing deposition of transparent conductive materials, such as indium tin oxide (ITO) or indium zinc oxide (IZO), on the outer surface of the second substrate 200. However, the present invention is not limited thereto, and the rear electrode 210 may be formed on the outer surface of the second substrate 200 by adhering a film including conductive materials or by printing conductive materials on the outer surface of the second substrate 200.

In a display device according to the present invention, the common electrode 130 is formed on the first substrate 100, and may be absent on the second substrate 200 (refer to FIG. 2B). In such display devices, due to static electricity caused during a color filter array process to be described herein below, defects may occur and interior elements thereof may be damaged. In the display device according to the present invention, the rear electrode 210 is formed on the second substrate 200, such that static electricity, caused during the color filter array process, may be dissipated outwards, and moreover, defects caused by the static electricity may be prevented.

Figure 3B:
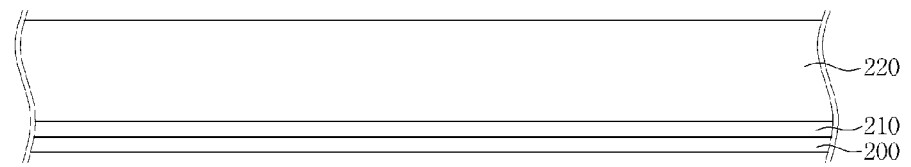

Subsequent to the rear electrode 210 being formed on the outer surface of the second substrate 200, a second auxiliary substrate 220 may be formed on the rear electrode 210 (refer to FIG. 3B).

The second auxiliary substrate 220 may include glass or plastics, and may have a thickness in a range of about 0.4 mm to about 0.7 mm.

The second auxiliary substrate 220 may be adhered to the rear electrode 210 by Van der Waal's force, which is caused when the second auxiliary substrate 220 is brought into contact therewith under an atmospheric pressure or in a vacuum state. However, the present invention is not limited thereto, and the second auxiliary substrate 220 may be adhered to the rear electrode 210 using an additional adhesive layer.

A conventional method of manufacturing a display device, including a thin substrate incorporating a rear electrode, may employ: adhering two substrates with a liquid crystal layer interposed therebetween, the two substrates each including a TFT array and a color filter array formed thereon; performing etching thereon; and then forming a rear electrode. In this case, however, a dropping stain may appear on the liquid crystal layer in the forming of the rear electrode, thereby causing deterioration in display quality.

According to the present invention, the rear electrode is formed on the thin substrate and then the auxiliary substrate is adhered thereon, prior to forming the color filter array, thus capable of preventing a dropping stain which may appear on the liquid crystal layer. Accordingly, the display quality may be improved and bending or distortion defects of the thin substrate may be prevented as well.

Figure 3C:
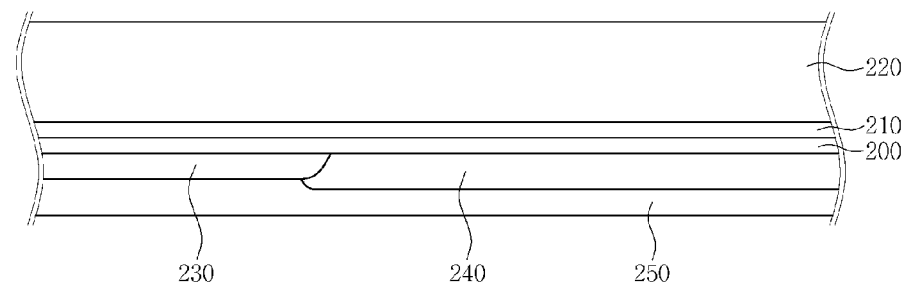

Subsequent to the second auxiliary substrate 220 being adhered on the rear electrode 210, the color filter array may be formed on the inner surface of the second substrate 200, the color filter array including a light shielding unit 230 having a lattice form, a color filter 240 disposed between the light shielding units 230, a planarization layer 250 configured to cover the light shielding unit 230 and the color filter 240 (refer to FIG. 3C).

The light shielding unit 230 may be formed on the second substrate 200 in a lattice form, more particularly, formed along the gate line, the data line, and the TFT formed on the first substrate.

The light shielding unit 230 may include, for example, photo-sensitive organic materials including a black pigment, and may prevent light leakage.

The color filter 240 may be formed between the light shielding units 230 provided in a lattice form. However, the present invention is not limited thereto, and the color filter 240 may be formed to overlap the light shielding unit 230.

The color filter 240 may display one of the primary colors, such as the three primary colors of red, green, and blue. However, the present invention is not limited thereto, and the color filter 240 may display one of cyan, magenta, yellow, and white.

The planarization layer 250 may be formed to cover the light shielding unit 230 and the color filter 240. The planarization layer 250 may include organic materials.

Figure 3D:
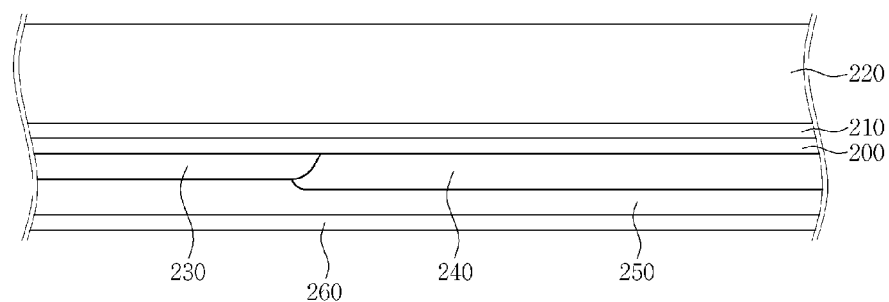

Subsequent to the color filter array being formed on the inner surface of the second substrate 200, a second alignment layer 260 may be formed on the color filter array, that is, more particularly, on the planarization layer 250 (refer to FIG. 3D).

Since the second alignment layer 260 has the same configuration as that of the first alignment layer 160, the detailed description pertaining thereto will be omitted for brevity (refer to FIG. 2C).

Figure 3E:
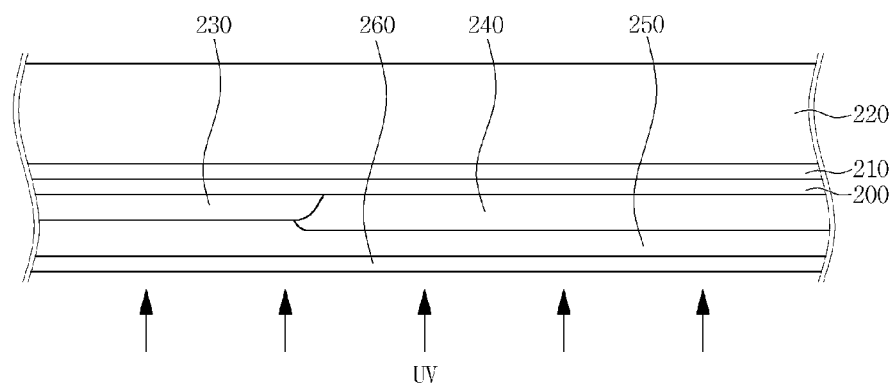

Subsequent to the second alignment layer 260 being formed on the color filter array, the second alignment layer 260 may be subsequently photo-aligned (refer to FIG. 3E).

Figure 2D:
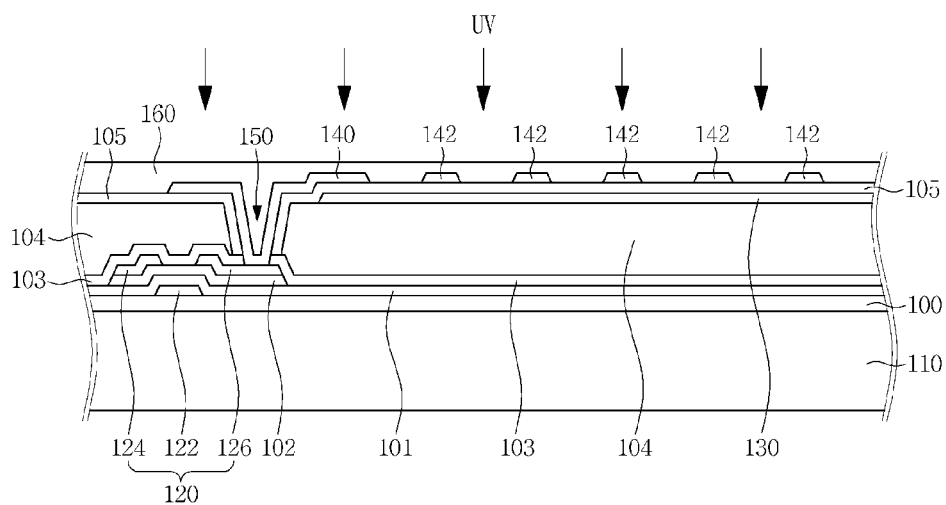

Since the photoalignment of the second alignment layer 260 is performed in the same manner as in the photoalignment of the first alignment layer 160, the descriptions pertaining thereto will be omitted for brevity (refer to FIG. 2D).

Figure 4A:
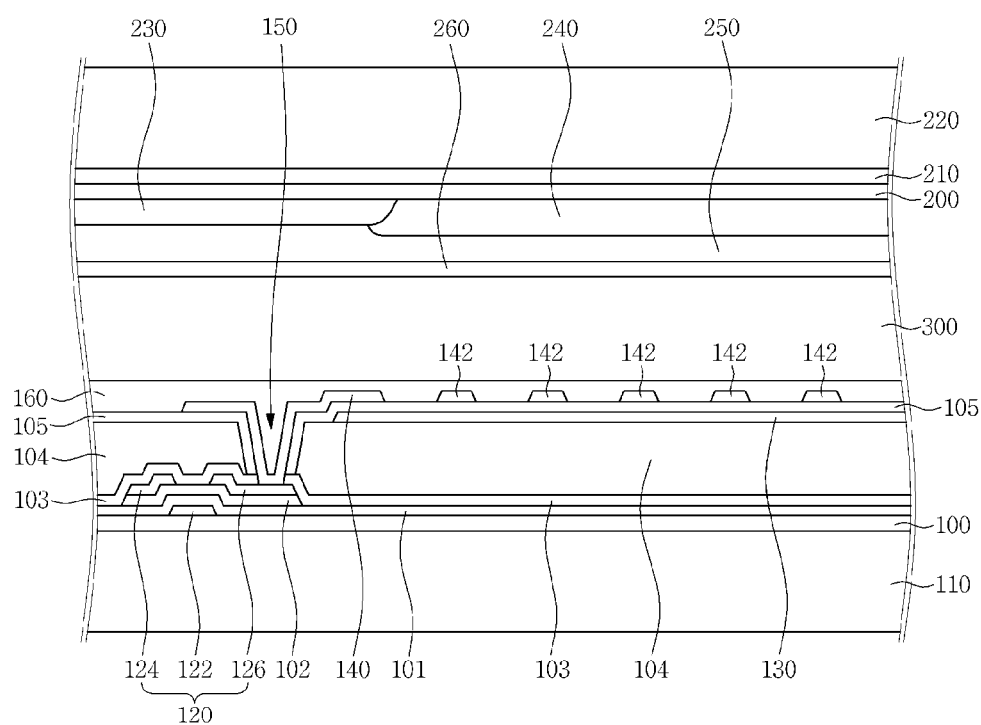
FIGS. 4A and 4B are cross-sectional views illustrating a process C of FIG. 1.
Figure 4B:
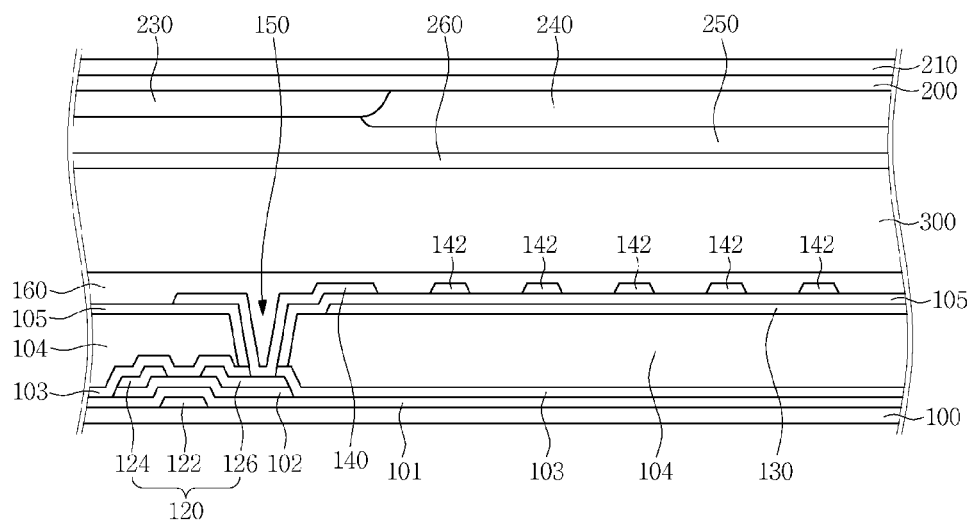

FIGS. 4A and 4B are cross-sectional views illustrating a process C of FIG. 1.

Firstly, subsequent to a liquid crystal layer 300 including a plurality of liquid crystal molecules being disposed between an inner surface of the first substrate 100 and an inner surface of the second substrate 200, the first substrate 100 and the second substrate 200 may be adhered together (refer to FIG. 4A).

For example, the liquid crystal molecules may be dispensed, in one drop filling (ODF) method, within an encapsulation pattern (not illustrated) formed along an outer line of each of the first substrate 100 or the second substrate 200. Subsequently, pressure is applied thereto to thereby adhere the first substrate 100 and the second substrate 200 to each other. However, the present invention is not limited thereto, and the first substrate 100 and the second substrate 200 may be adhered together in different manners, subsequent to the liquid crystal layer 300 being interposed therebetween.

Subsequent to the first substrate 100 and the seconds substrate 200 being adhered together, the first auxiliary substrate 100 and the second auxiliary substrate 220 may be removed (refer to FIG. 4B).

The first auxiliary substrate 110 and the second auxiliary substrate 220 may be respectively removed from the first substrate 100 and the second substrate 200, by applying a shear force to an end portion of each of the first auxiliary substrate 110 and the second auxiliary substrate 220.

From the foregoing, it will be appreciated that various embodiments in accordance with the present disclosure have been described herein for purposes of illustration, and that various modifications may be made without departing from the scope and spirit of the present teachings. Accordingly, the various embodiments disclosed herein are not intended to be limiting of the true scope and spirit of the present teachings. Various features of the above described and other embodiments can be mixed and matched in any manner, to produce further embodiments consistent with the invention.

What is claimed is:

1. A method of manufacturing a display device, comprising:
   adhering a first auxiliary substrate on an outer surface of a first substrate;
   forming a rear electrode on an outer surface of a second substrate, the second substrate being disposed to oppose the first substrate;
   adhering a second auxiliary substrate on the rear electrode;
   disposing a liquid crystal layer between an inner surface of the first substrate and an inner surface of the second substrate;
   adhering the first substrate and the second substrate together; and
   removing the first auxiliary substrate and the second auxiliary substrate from the first substrate and the second substrate, respectively, the removal of the first auxiliary substrate and the second auxiliary substrate comprising applying a shear force on an end portion of each of the first auxiliary substrate and the second auxiliary substrate to remove them from the first substrate and the second substrate, respectively.

2. The method of claim 1, the first substrate and the second substrate each having a thickness in a range of about 0.05 millimeters (mm) to about 0.1 mm.

3. The method of claim 1, the first auxiliary substrate and the second auxiliary substrate each having a thickness in a range of about 0.4 mm to about 0.7 mm.

4. The method of claim 1, the adhering of the first auxiliary substrate comprising bringing the first auxiliary substrate into contact with an outer surface of the first substrate and adhering them under an atmospheric pressure or in a vacuum state.

5. The method of claim 1, the forming of the rear electrode comprising depositing indium tin oxide (ITO) or indium zinc oxide (IZO) on the outer surface of the second substrate.

6. The method of claim 1, the adhering of the second auxiliary substrate comprising bringing the second auxiliary substrate into contact with the rear electrode and adhering them, under an atmospheric pressure or in a vacuum state.

7. The method of claim 1, further comprising, subsequent to the adhering of the first auxiliary substrate on the outer surface of the first substrate, forming a thin film transistor (TFT) array on the inner surface of the first substrate,
   the TFT array comprising:
      a gate line,
      a data line intersecting the gate line,
      a TFT connected to the gate line and the data line, the TFT including an oxide semiconductor selected from a group consisting of zinc oxide, indium gallium-zinc oxide and indium-zinc-tin oxide,
      a pixel electrode connected to the TFT, the pixel electrode including a plurality of branch electrodes, and
      a common electrode disposed to be insulated from the pixel electrode.

8. The method of claim 7, further comprising, subsequent to the formation of the TFT array on the inner surface of the first substrate, forming a first alignment layer on the TFT array.

9. The method of claim 8, the first alignment layer comprising a photo-sensitive polymer material.

10. The method of claim 8, further comprising, subsequent to the formation of the first alignment layer on the TFT array, performing photoalignment of the first alignment layer.

11. The method of claim 10, the performing of the photoalignment comprising irradating ultraviolet (UV) light onto the first alignment layer, the UV light polarized in a predetermined direction.

12. The method of claim 7, the TFT array further comprising an organic layer interposed between the TFT and the pixel electrode, the organic layer being perforated by a contact hole, the pixel electrode being connected to the TFT via the contact hole.

13. The method of claim 1, further comprising, subsequent to the adhering of the second auxiliary substrate on the rear electrode, forming a color filter array on the inner surface of the second substrate, the color filter array comprising:

light shielding units having a lattice form,
a color filter between the light shielding units, and
a planarization layer configured to cover the light shielding unit and the color filter.

14. The method of claim 13, further comprising, subsequent to the formation of the color filter array on the inner surface of the second substrate, forming a second alignment layer on the color filter array.

15. The method of claim 14, the second alignment layer comprising a photo-sensitive polymer material.

16. The method of claim 14, further comprising, subsequent to the formation of the second alignment layer on the color filter array, performing photoalignment of the second alignment layer.

17. The method of claim 16, the performing of the photoalignment comprising irradiating UV light onto the second alignment layer, the UV light polarized in a predetermined direction.

18. A method of manufacturing a display device comprising:
   adhering a first auxiliary substrate on a first substrate;
   forming a TFT array on an inner surface of the first substrate, the TFT array comprising:
      a gate line,
      a data line intersecting the gate line,
      a TFT connected to the gate line and the data line, the TFT including an oxide semiconductor layer selected from a group consisting of zinc oxide, indium gallium oxide and indium-zinc-tin oxide,
      an organic layer arranged on the TFT and being perforated by a contact hole,
      a pixel electrode arranged on the organic layer and connected to the TFT via the contact hole, and
      a common electrode arranged to be insulated from the pixel electrode;
   forming a rear electrode on a second substrate;
   adhering a second auxiliary substrate on the rear electrode so that the rear electrode is positioned between the second substrate and the second auxiliary substrate;
   disposing a liquid crystal layer between the first substrate and the second substrate;
   adhering the first substrate and the second substrate together; and
   removing the first auxiliary substrate and the second auxiliary substrate from the first substrate and the second substrate, respectively, by applying a shear force on an end portion of the first auxiliary substrate or the second auxiliary substrate.

19. The method of claim 18, further comprising, forming a first alignment layer on the first substrate and forming a second alignment layer on the second substrate.

20. The method of claim 19, further comprising, performing UV photoalignment of the first alignment layer and performing UV photoalignment of the second alignment layer.

* * * * *